US011527431B2

(12) United States Patent
Chan et al.

(10) Patent No.: US 11,527,431 B2
(45) Date of Patent: Dec. 13, 2022

(54) METHODS OF SEMICONDUCTOR DEVICE PROCESSING (71) Applicant: IMEC vzw, Leuven (BE)

(72) Inventors: Boon Teik Chan, Wilsele (BE); Efrain Altamirano Sanchez, Kessel-Lo (BE); Geert Mannaert, Lubbeek (BE)

(73) Assignee: IMEC vzw, Leuven (BE)

( * ) Notice: Subject to any disclaimer, the term of this patent is extended or adjusted under 35 U.S.C. 154(b) by 156 days.

(21) Appl. No.: 17/119,802

(22) Filed: Dec. 11, 2020

(65) Prior Publication Data

US 2021/0193510 A1 Jun. 24, 2021

(30) Foreign Application Priority Data

Dec. 19, 2019 (EP) ..................................... 19218166

(51) Int. Cl.
*H01L 21/762* (2006.01)
*H01L 21/8234* (2006.01)
(52) U.S. Cl.
CPC .................. *H01L 21/76264* (2013.01); *H01L 21/823431* (2013.01); *H01L 21/823468* (2013.01)
(58) Field of Classification Search
CPC ......... H01L 29/66795; H01L 21/76264; H01L 21/823468; H01L 21/823431; H01L 21/823481; H01L 21/823821; H01L 21/823878; H01L 27/1207; H01L 27/1211; H01L 21/02123; H01L 21/823807; H01L 21/845; H01L 29/66545; H01L 27/092; H01L 21/02255; H01L 21/02236; H01L 29/66666; H01L 29/7827; H01L 29/6656;

(Continued)

(56) References Cited

U.S. PATENT DOCUMENTS 9,324,713 B1 4/2016 Yu et al.
9,390,915 B1 7/2016 Li et al.
9,704,864 B2 7/2017 Park et al.
(Continued)

FOREIGN PATENT DOCUMENTS

CN 109686779 A 4/2019
DE 10 2018 127 148 A1 6/2019

OTHER PUBLICATIONS

"FinFET spacer formation without fin damage", IP.com Prior Art Database, Mar. 25, 2014, pp. 1-3.
(Continued)

*Primary Examiner* — Mouloucoulaye Inoussa
(74) *Attorney, Agent, or Firm* — Knobbe, Martens, Olson & Bear, LLP (57) ABSTRACT

According to an aspect of the disclosed technology, there is provided a method comprising: providing a substrate, the substrate supporting an STI-layer and a set of fin structures, each fin structure comprising an upper portion protruding above the STI-layer, forming a spacer layer over the upper portions of the set of fin structures and the STI-layer, forming a sacrificial layer over the spacer layer, the sacrificial layer at least partially embedding the upper portions of the fin structures, partially etching back the sacrificial layer to expose spacer layer portions above upper surfaces of the upper portions of the set of fin structures, and etching the spacer layer and exposing at least the upper surfaces of the upper portions of the set of fin structures, while the sacrificial layer at least partially masks spacer layer portions above the STI-layer.

18 Claims, 7 Drawing Sheets

(58) Field of Classification Search
CPC ........... H01L 21/31144; H01L 29/0847; H01L 29/4966
See application file for complete search history.

(56) References Cited

U.S. PATENT DOCUMENTS

| | | |
|---|---|---|
| 9,887,094 B1 | 2/2018 | Qi et al. |
| 10,068,992 B2 | 9/2018 | Lo et al. |
| 10,170,544 B2 | 1/2019 | Xie et al. |
| 10,340,271 B2 | 7/2019 | Wang et al. |
| 2016/0020150 A1 | 1/2016 | You et al. |
| 2017/0025313 A1 | 1/2017 | Ching et al. |
| 2017/0141220 A1 | 5/2017 | Ching et al. |

OTHER PUBLICATIONS

Jun et al.,"Challenges and solutions for 14nm FinFET etching," *2015 China Semiconductor Technology International Conference*, Shanghai, 2015, pp. 1-4.

Extended European Search Report dated Jun. 26, 2020 in counterpart European Application No. 19218166.7 in 7 pages.

METHODS OF SEMICONDUCTOR DEVICE PROCESSING

CROSS-REFERENCE TO RELATED APPLICATIONS

This application claims foreign priority to European Patent Application No. EP 19218166.7, filed Dec. 19, 2019, the content of which is incorporated by reference herein in its entirety.

BACKGROUND

Technical Field

The disclosed technology generally relates to the field of semiconductor devices, such as fin field-effect transistors (finFETs), and more particularly to methods of processing the same.

Description of the Related Technology

Modern circuit fabrication typically includes isolating adjacent semiconductor device components. In the case of fin field-effect transistors (finFETs), adjacent finFETs may be isolated from each other by shallow trench isolation (STI). Fins may be fabricated by etching trenches in the substrate wherein insulating material (typically an oxide) may be deposited in the trenches to form the STI or STI-layer. The STI is typically formed early during the fabrication process and before the finFETs are formed. Hence, the STI may be exposed to numerous processing steps leading up to the finished device. More specifically, the STI may be exposed to various etching steps during the device fabrication. For instance, finFET fabrication may involve recessing portions of the fins (e.g., etching back the fins) where source/drain regions are to be formed by epitaxy. Taking as an example a replacement metal gate (RMG) or gate-last flow, parts of the fins which are not to be recessed may be covered by dummy gates. A gate spacer may cover the dummy gates. The gate spacer is typically deposited as a conformal layer by atomic layer deposition (ALD), and may accordingly be deposited also on the fin parts exposed by the dummy gates, e.g., the fin parts which are to be recessed. Thus, the gate spacer are typically opened on the fin parts to be recessed. There is however a risk of over-etching into the STI during etching of the gate spacer. This may in turn reduce a thickness of the STI and may lead to formation of non-uniform electric properties of the finFETs. If the over-etch into the STI is deep, there is even a risk of dummy gate collapse. This issue is anticipated to increase due to the trend towards ever increasing fin heights and denser fin and gate patterns.

SUMMARY OF CERTAIN INVENTIVE ASPECTS

An objective of the disclosed technology is to address the afore-mentioned issue of over-etching into the STI. More generally, it is an objective to provide an approach allowing the STI to be protected, at least partly, during various processing steps which may be applied during semiconductor device fabrication. Further and alternative objectives may be understood from the following.

According to an aspect of the disclosed technology, there is provided a method comprising:

providing a substrate, the substrate supporting an STI-layer and a set of fin structures, each fin structure comprising an upper portion protruding above the STI-layer, forming a spacer layer (e.g., a conformal spacer layer) over the upper portions of the set of fin structures and the STI-layer, forming a sacrificial layer over the spacer layer, the sacrificial layer at least partially embedding the upper portions of the fin structures, partially etching back the sacrificial layer to expose spacer layer portions (e.g., portions of the spacer layer) above upper surfaces of the upper portions of the set of fin structures, and etching the spacer layer and exposing at least the upper surfaces of the upper portions of the set of fin structures, while the sacrificial layer at least partially masks spacer layer portions (e.g., portions of the spacer layer) above the STI-layer.

As used herein, reference to "each" of a particular element (e.g., "each fin structure") may refer to two or more of the elements, and may or may not refer to every one of the elements in the device. For example, "each fin structure" may refer to individual ones of a plurality of fin structures and not necessarily every single fin structure in the device.

By various methods, the upper portions of the set of fin structures may be made accessible for further processing with a mitigated or at least reduced risk of over-etching into the STI-layer. This can be enabled by the presence of the partially etched back sacrificial layer remaining on the spacer layer portions above the STI-layer. The sacrificial layer may subsequently be removed.

The sacrificial layer may be formed with a thickness exceeding a height of the upper portions above the STI-layer. The sacrificial layer may, following deposition, embed (e.g., at least partially embed) and cover (e.g., at least partially or completely cover) the upper portions of the fin structures, which already have been covered (e.g., at least partially covered) by the spacer layer (and optionally also a liner layer as described below). By the etch back of the sacrificial layer, an upper surface of the sacrificial layer may be lowered to a level located at or below the spacer layer portions above the upper surfaces of the upper portions of the fin structures. Since the etch back is only partial, the level of the upper surface of the sacrificial layer may be located at a level higher than a level of the spacer layer portions above the STI-layer (e.g., such that the spacer layer portions above the STI-layer remain covered, e.g., at least partially covered, by the etched back sacrificial layer).

As may be appreciated, the spacer layer and the sacrificial layer may be formed of different materials, thereby allowing the spacer layer to be etched selectively with respect to the sacrificial layer. As may be understood by a person skilled in the art a selective etch of a feature or material A with respect to a feature or material B can refer to the feature/material A being etched at a greater rate than the feature/material B. For example, the spacer layer may be etched selectively with respect to the sacrificial layer such that the spacer layer (material) may be removed above the upper surfaces of the upper portions of the fin structures while the sacrificial layer (material) may remain on spacer layer portions above the STI-layer. Conversely, the etch back of the sacrificial layer may comprise selectively etching the sacrificial layer with respect to the spacer layer. Advantageously, a selective etch of a feature/material A with respect to a feature/material B may refer to an etch rate ratio of 2:1 or higher, e.g., 10:1 or higher.

Optionally, prior to forming the spacer layer, a liner layer may be formed over the upper portions of the fin structures. The liner layer may be an oxide liner layer. The liner layer may be formed as a conformal liner layer in some instances, and also being formed over the STI-layer. Prior to forming the spacer layer, the upper portions of the fin structures (and possibly also the STI-layer) may be covered (e.g., at least partially covered) by the liner layer. In various implementations, the spacer layer (e.g., a conformal spacer layer) may be formed to cover (e.g., at least partially cover) the upper portions of the fin structures (and the STI-layer) which may already be covered (e.g., at least partially covered) by the liner layer. The liner layer may among others serve to help protect the parts of the upper portions of the fin structures which are not made accessible by the aforementioned method, for instance during dummy gate removal of a subsequent RMG process as will be further described herein.

In some embodiments where a liner layer is present on the upper portions of the fin structures, exposing the upper surfaces of the upper portions of the fin structures may, in addition to etching the spacer layer, comprise etching the liner layer. For example, by opening the spacer layer above the fin structures, the liner layer may be exposed above the fin structures and in turn be opened, wherein the upper surfaces of the upper portions may be exposed.

As discussed above, the method can allow exposing areas of the fin structures such that one or more processing steps may be performed thereon. Advantageous embodiments of some such processing steps will be provided in the following. The exposed areas of the fin structures can refer to the exposed at least upper surfaces of the upper portions of the set of fin structures. For example, the exposed areas of the fin structures can refer to areas of the upper portions of the fin structures exposed by the disclosed technology or any of the embodiments thereof.

The method may further comprise (e.g., subsequent to exposing the fin structures by the spacer layer etch and optional liner layer etch) subjecting the fin structures to a fin recess process comprising etching back exposed areas of the fin structures. By etching back the exposed upper surfaces of the upper portions of the set of fin structures recessed fin areas may be formed. Advantageously, the upper surfaces of the fin structures may be etched back to a level at or above a level of an upper surface of the STI-layer.

The method may further comprise removing the sacrificial layer e.g., subsequent to the fin recess process. Thereby, the sacrificial layer (e.g., partially etched back sacrificial layer of reduced thickness) may mask (e.g., at least partially mask) the spacer layer and the STI-layer (and the optional liner layer intermediate the STI-layer and the spacer layer) in areas in between the fin structures also during the fin recess.

The method may further comprise performing epitaxy on exposed areas of the fin structures. Semiconductor bodies may be grown on the exposed areas of the fin structures. The semiconductor bodies may be doped (e.g., in situ and/or ex situ) to define source/drains, e.g., for a FET device.

According to some embodiments, the set of fin structures may comprise a first subset of fin structures in a first region and a second subset of fin structures in a second region. The method may further comprise, e.g., subsequent to etching the spacer layer and exposing the at least upper surfaces of the upper portions of the first and second subset of fin structures:
  forming an epitaxy mask covering (e.g., at least partially covering) the first subset of fin structures in the first region,
  performing epitaxy on exposed areas of the second subset of fin structures in the second region, while the epitaxy mask masks (e.g., at least partially masks) the first subset of fin structures in the first region, and
  removing the epitaxy mask from the first region.

Thereby, epitaxy may be performed selectively in the second region while the first region is masked. Semiconductor bodies may be grown selectively on the exposed areas of the second set of fin structures. The epitaxially grown semiconductor bodies may be doped (e.g., in situ and/or ex situ) to form an n-type or p-type semiconductor body, as desired. During the subsequent removal of the epitaxy mask from the first region (e.g., by etching), the spacer layer portions present above the STI-layer may protect (e.g., at least partially protect) the STI-layer (and the optional liner layer if present) in areas in between the first subset of fin structures in the first region. As may be understood from the above, the epitaxy may be preceded by recessing of the first and second subsets of fin structures.

The method may further comprise, e.g., subsequent to removing the epitaxy mask from the first region:
  forming an epitaxy mask covering (e.g., at least partially covering) the second subset of fin structures (including the epitaxially grown bodies thereon) in the second region,
  performing epitaxy on exposed areas of the first subset of fin structures in the first region, while the epitaxy mask masks (e.g., at least partially masks) the second subset of fin structures in the second region, and
  removing the epitaxy mask from the epitaxially grown portions of the second region.

Thereby, the selective epitaxy performed in the second region may be followed by selective epitaxy in the first region. This can allow among others semiconductor bodies of different conductivity types to be formed in the first and second regions. For instance, the semiconductor bodies in the first region and second regions may be formed to define n- and p-type source/drains, respectively, or vice versa.

According to some embodiments, the set of fin structures may form or define a first set of fin structures in a first region of the substrate. The substrate may further support a second set of fin structures in a second region of the substrate,
  wherein the spacer layer (e.g., a conformal spacer layer in some instances), and the sacrificial layer may be formed in both the first region and the second region,
  wherein the partially etching back of the sacrificial layer may be performed in the first region while masking (e.g., at least partially masking) the sacrificial layer in the second region, and
  wherein the etching the spacer layer may be performed in the first region while the sacrificial layer covers (e.g., at least partially covers) the spacer layer in the second region.

Thereby the upper portions of the first set of fin structures may be made accessible for further processing while the second set of fin structures may remain covered (e.g., at least partially covered) by spacer layer and the sacrificial layer (which not is etched back in the second region).

The method may, while the sacrificial layer covers (e.g., at least partially covers) the spacer layer in the second region, further comprise subjecting the first set of fin structures to a fin recess process comprising etching back exposed areas of the first set of fin structures, and/or performing epitaxy on exposed areas of the first set of fin structures. Thereby, recessed fin areas and/or epitaxially grown bodies of/on the first set of fin structures in the first region may be formed while, in the second region, the STI-layer and the second set of fin structures remain covered (e.g., at least partially covered) by the spacer layer and the sacrificial layer.

Subsequent to etching the spacer layer in the first region, or subsequent to subjecting the first set of fin structures to a fin recess process, or subsequent to performing epitaxy on exposed areas of the first set of fin structures, the method may further comprise, while masking (e.g, at least partially masking) the first set of fin structures in the first region:

in the second region partially etching back the sacrificial layer, and in the second region, etching the spacer layer and exposing at least the upper surfaces of the upper portions of the second set of fin structures, while the sacrificial layer masks (e.g, at least partially masks) the spacer layer above the STI-layer. Thereby, the second set of fin structures in the second region may be accessed for further processing steps in a manner corresponding to that described above in relation to the first set of fin structures.

For instance, the method may further comprise subjecting the second set of fin structures to a fin recess process comprising etching back exposed areas of the second set of fin structures, and/or performing epitaxy on exposed areas of second set of fin structures.

The disclosed technology and the above-described embodiments thereof are generally applicable to scenarios where selective access to fin structures is desired, while mitigating the risk of damage to an adjacent STI-layer. One notable application relates to the scenario described in the background section, where the gate spacer is to be opened for revealing the fin structures (e.g., prior to fin structure recessing and/or source/drain epitaxy). In some such scenarios, the substrate may support at least one gate structure extending across the set of fin structures, wherein the spacer layer can form a gate spacer layer and can be formed over the gate structure(s), the upper portions of the set of fin structures and the STI-layer.

The spacer layer may comprise oxycarbide (SiCO) or silicon nitride (SiN). These materials can allow forming of a gate spacer layer of advantageously low-k. However, more generally, the spacer layer may also be formed of another material which may selectively be etched with respect to the sacrificial layer.

BRIEF DESCRIPTION OF THE DRAWINGS

The above, as well as additional objects, features and advantages of the disclosed technology, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

Methods of semiconductor device processing allowing among others protecting (e.g, at least partially protecting) an STI-layer will now be described with reference to FIGS. 1-13. In the following, the example method is described in relation to formation of complementary finFETs. However, as is readily appreciated by a person skilled in the art, other examples than the ones disclosed below are equally possible within the scope of the disclosed technology, such as horizontal nanowire FETs (NWFETs).

Figure 1:
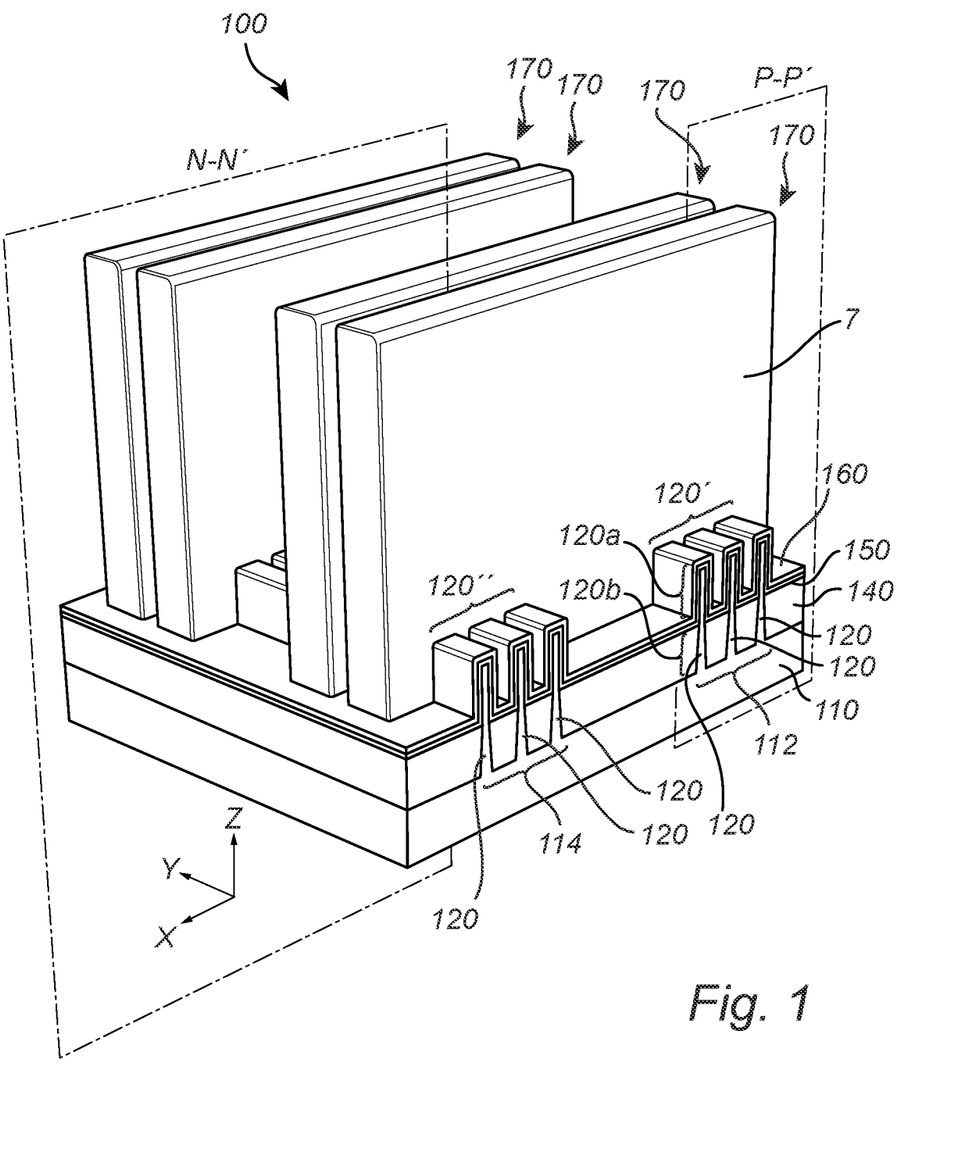
FIGS. 1, 2, 3, 4, 5, 6, 7, 8, 9, 10, 11, 12, and 13 illustrate various intermediate structures of methods of semiconductor device processing.

In FIG. 1, a perspective view of a structure 100 comprising a substrate 110, supporting a set of fin structures 120, and an STI-layer 140 is shown. The structure 100 represents a preliminary device structure which may be used to form finFETs. In FIG. 1, directions X and Y indicate a first and a second horizontal direction, respectively, and Z indicates a vertical direction. Directional qualifiers such as horizontal and vertical hereby can be understood in relation to a local frame of reference of the structure 100. More specifically, a horizontal direction or orientation may be understood as a direction or orientation parallel to a main plane of extension of the substrate 110. Correspondingly, a vertical direction of orientation may be understood as a direction or orientation normal to the main plane of extension of the substrate 110. As may be appreciated, terms such as "over", "above", "below", "upper", "bottom" etc. can be understood as relative positions as viewed along a vertical direction. The structure 100 may extend beyond the illustrated section along the directions X and Y. It is noted that the relative dimensions of the shown elements, such as the relative thickness of layers, is merely schematic and may, for the purpose of illustrational clarity, differ from a physical structure.

The substrate 110 may be any substrate, suitable for semiconductor processing. The substrate 110 may be a silicon (Si) substrate, a germanium (Ge) substrate, a silicon-germanium (SiGe) substrate. Other examples include a silicon-on-insulator (SOI) substrate, a germanium-on-insulator (GeOI) substrate or a silicon-germanium-on-insulator (SiGeOI) substrate.

The fin structures 120 may be elongated and fin-shaped structures. The fin structures 120 may, as shown in FIG. 1, protrude above the substrate 110 in the Z direction and extend on the substrate 110 along the Y direction. The fin structures 120 may be formed in any manner, e.g., by patterning fins in the substrate 110. Single patterning (e.g., litho-etch), or multiple-patterning techniques (e.g., self-aligned double patterning, SADP, or self-aligned quadruple patterning, SAQP) may be used depending on the desired fin dimensions and pitches. The fin structures 120 may be formed of one material or a combination of different materials. For instance, the fin structures 120 may comprise a stack of semiconductor materials along the Z direction, a stack of Si and SiGe layers being one non-limiting example. The substrate 110 shown in FIG. 1 has a first region 112 and a second region 114. The first region 112 of the substrate 110 supports a first set of fin structures 120'. The second region 114 of the substrate 110 supports a second set of fin structures 120". The first set of fin structures 120' and the second set of fin structures 120" form, respectively, a first subset and a second subset of the fin structures 120 and may be referred to as such in the following description. As will be further discussed below, the first region 112 and the second region 114 may represent regions in which devices of a first and second conductivity type, respectively, are to be formed.

The STI-layer 140 may be formed subsequent to the formation of the fin structures 120 in some implementations. The STI-layer 140 may be formed in any manner, e.g., comprising depositing a layer of insulating material and etching back/recessing (possibly after planarizing an upper surface of the deposited insulating material layer) the insulating material layer to form the STI-layer 140 with a desired thickness. The STI-layer 140 may e.g., be formed by a chemical vapor deposition (CVD) deposited oxide, such as silicon oxide, or by a flowable chemical vapor deposition (FCVD) oxide. FIG. 1 shows that the STI-layer 140 can embed (e.g., at least partially embed) a lower portion 120b of each fin structure 120 such that an upper portion 120a of each fin structure 120 protrudes above the STI-layer 140. A typical thickness of the STI-layer 140 (e.g., as seen in the Z direction) may be in a range of 20 to 120 nm in some implementations. The upper portions 120a of the fin structures 120 may for instance protrude above the STI-layer 140 by about 40 to 100 nm, depending on circumstances.

FIG. 1 further shows that the upper portions 120a of the set of fin structures 120 and the STI-layer 140 may be covered (e.g., at least partially covered) by a liner layer 150. The liner layer 150 may be a conformal layer covering (e.g., at least partially covering) the upper portions 120a as well as the STI-layer 140 in some instances. The liner layer 150 may for instance be formed with a thickness in the range of 2-4 nm. The liner layer 150 may be formed subsequent to recessing of the STI-layer 140 in some instances. The liner layer 150 may be an oxide liner layer, such as a thermal oxide layer or an atomic layer deposition (ALD) oxide layer. Silicon oxide represents a typical and convenient choice of material for the oxide layer, however it is contemplated that also other oxide materials, as well as non-oxide materials such as nitrides, are possible. The liner layer 150, which may be referred to as a pad oxide, may serve to protect (e.g., at least partially protect) the fin structures 120 during subsequent processing steps, in particular during dummy gate removal, discussed further below.

The substrate 110 can further support a plurality of gate structures 170 forming sacrificial gates or dummy gates. The gate structures 170 may act as placeholders for final metal gates which are to be formed at a later stage. The gate structures 170 can extend across the set of fin structures 120 e.g., along the X direction. FIG. 1 shows that the gate structures 170 straddle or surround the upper portions 120a of the fin structures 120 on three sides. The gate structures 170 may be formed in any manner, such as by patterning dummy gates in a layer of amorphous silicon.

Still with reference to FIG. 1, the method can proceed by forming a gate spacer layer (e.g., conformal gate spacer layer in some instances) 160. The gate spacer layer 160 may as shown cover (e.g., at least partially cover) the upper surfaces and sidewalls of the gate structures 170. The gate spacer layer 160 may further be formed over the upper portions 120a of the set of fin structures 120 and over the STI-layer 140, e.g., in areas between the fin structures 120. If a liner layer 150 already has been formed to cover (e.g., at least partially cover) the upper portions 120a of the fin structures 120 and the upper surface of the STI-layer 140, the gate spacer layer 160 may be formed thereon. For example, the gate spacer layer 160 may cover (e.g., at least partially cover) the liner layer 150 covering (e.g., at least partially covering) the upper portions 120a of the fin structures 120 and the upper surface of the STI-layer 140. The gate spacer layer 160 may be an ALD deposited nitride, oxide or oxycarbide or some other material, advantageously of low-k, such as silicon nitride ($Si_3N_4$), or silicon oxycarbide (SiCO). A typical thickness of the gate spacer layer 160 in some examples may be in a range of 4 to 15 nm, depending on the device dimensions. For brevity, the gate spacer layer 160 may in the following be referred to as the spacer layer 160.

A number of process steps which may be applied to the structure 100 will now be described with reference to FIGS. 2-6. For conciseness, the second region 114 has however been omitted from the figures such that the processing steps are shown in relation to the first region 112 and the first set/subset of fin structures 120'. It should however be understood that the processing steps to be described in connection with the first region 112 may be applied simultaneously (e.g., in parallel) or sequentially (e.g., in series) in the second region 114.

Figures 2, 3:
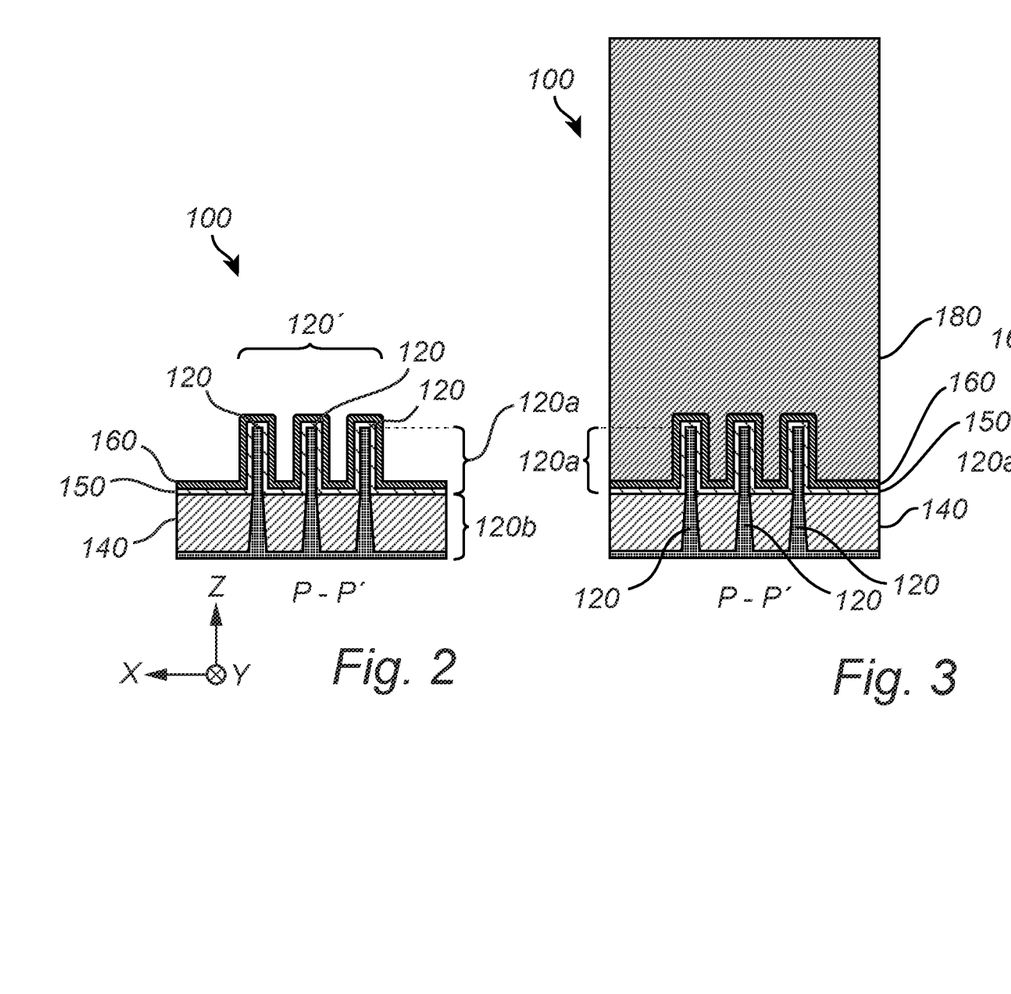

FIG. 2 is a cross-sectional view taken along a plane shown as PP' in FIG. 1 in the first region 112 and depicts the first set of fin structures 120'.

In FIG. 3, a sacrificial layer 180 has been formed on the gate spacer layer 160. FIG. 3 shows that the sacrificial layer 180 embeds (e.g., at least partially embeds) the upper portions 120a of the fin structures 120 covered (e.g, at least partially covered) by the spacer layer 160 (and the optional liner layer 150). The sacrificial layer 180 may be a planarization layer e.g., a layer planarizing the structure 100. The sacrificial layer 180 may for instance be an organic spin-on-layer such as spin-on-carbon (SOC) or a bottom antireflective coating (BARC). However it is contemplated that also other materials may be used such as non-organic spin-on materials such as oxide-based materials, or a spin-on-glass material. The sacrificial layer 180 may be formed with a thickness exceeding a height of the upper portions 120a of the fin structures 120 above the STI-layer 140. For example, the sacrificial layer 180 can comprise portions located above the STI-layer 140 (e.g., in areas between the fin structures 120) and portions located above the fin structures 120. Hence, the relative term "above" can hereby be understood as the referenced layer or structure (e.g., a portion of the sacrificial layer 180) being at a higher level than the other layer or structure (e.g., the STI-layer 140 or the fin structures 120) while also being aligned with the same as seen along the vertical direction. For example, a referenced layer or structure (e.g., a portion of the sacrificial layer 180) being above another layer or structure (e.g., the STI-layer 140 or the fin structures 120) can imply that the referenced layer or structure covers (e.g., at least partially covers) the other layer or structure, either directly (by being formed directly on the other layer or structure) or indirectly (by being formed on the layer or structure with one or more layers or structures in-between). By way of example, the sacrificial layer 180 may be formed with a thickness in a range of 100 to 250 nm (e.g., measured from the upper surface of the STI-layer 140), e.g., depending on the respective heights of the gate structures 170 and upper portions 120a. The thickness may advantageously be such that also the gate structures 170 are covered (e.g., at least partially covered) by the sacrificial layer 180 in some instances.

Figure 4:
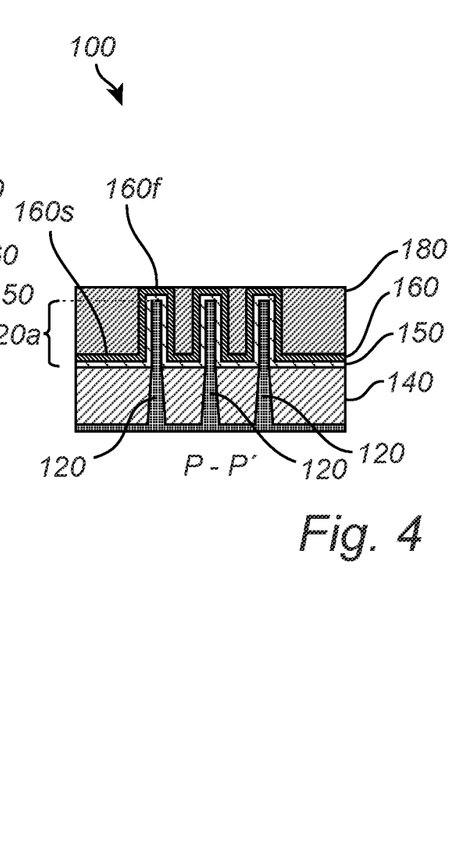

With reference to FIG. 4, the method can proceed by partially etching back the sacrificial layer 180 to expose the spacer layer portions 160f located above the upper/top-most surfaces of the upper portions 120a of the set of fin structures 120. The etching back of the sacrificial layer 180 may be performed using dry etching, such as a reactive ion etch (RIE). The depth of the etch back may be controlled by timing, and/or by stopping the etching when detecting the etching reaching the spacer layer 160 (e.g., by end-point-detection). As shown in FIG. 4, subsequent to the etch back, a sacrificial layer 180 of a reduced thickness can remain on the spacer layer portions 160s covering (e.g., at least partially covering) the STI-layer 140 (which may be referred to as the STI spacer layer portions) and (if present) the portions of the liner layer 150 on the STI-layer 140. As shown in FIG. 4 the etch back may be stopped such that an upper surface of the sacrificial layer 180 becomes flush, or at least substantially flush, with the spacer layer portions 160f. It is however contemplated that the sacrificial layer 180 may be further etched back to a level below the spacer layer portions 160f. In any case, at least a thickness portion of the sacrificial layer 180 can remain on the STI spacer layer portions 160s.

Figure 5:
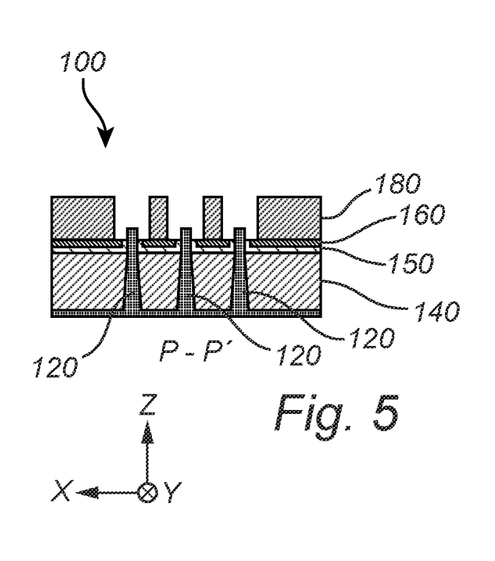

As shown in FIG. 5, the method can subsequently proceed by etching the spacer layer 160 and (if present) the liner layer 150 to expose at least the upper surfaces of the upper portions 120a of the set of fin structures 120. As further shown, after exposing upper surfaces of the upper portions 120a further etching may be performed such that the fin structures 120 may be etched back in a process known as a fin recess process. The etching back the exposed areas of the fin structures 120 may proceed until a desired reduced height of the fin structures 120 is achieved. Although the aforementioned etching may be selective to the sacrificial layer 180, some (further) partial etch back of the sacrificial layer 180 may still occur, although to a lesser extent than e.g., the fin structures 120.

Advantageously in terms of process efficiency, the etching of the spacer layer 160, the liner layer 150 (if present) and the fin structures 120 may be achieved in a single continuous etching process in some implementations. Hence, during the etching spacer layer portions 160 (and liner layer portions 150) formed along the sidewalls of the upper portions 120a may be etched back/recessed together with the upper portions 120a. By way of example, a silicon nitride (SiN) or silicon oxycarbide (SiOC) spacer layer 160, an oxide liner layer and a Si or SiGe-based fin structure 120 may be etched in a continuous process, with some degree of selectivity with respect to an organic spin-on sacrificial layer 180 using sulfur hexafluoride/carbon tetrafluoride/nitrogen $SF_6/CF_4/N_2$- or $CF_4$-based dry etching chemistries. However, it is contemplated that one or more of the spacer layer 160, the liner layer 150 and the fin structures 120 alternatively may be etched in separate etching steps employing different etching chemistries. In any case, during the etching, the sacrificial layer 180 can advantageously mask (e.g., at least partially mask) the spacer layer portions 160s above the STI-layer 140. At the stage of the method shown in FIG. 5, the fin structures have accordingly been made accessible for processing, and subjected to fin recessing, with reduced or without any over-etch into the STI-layer 140.

Figure 6:
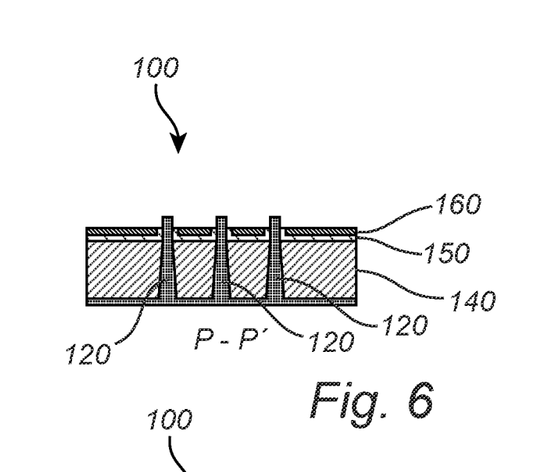

With reference to FIG. 6, the method may further proceed by removing the sacrificial layer 180 subsequent to the fin recess process. The sacrificial layer 180 may be removed by e.g., a selective etching process such as selective etching of the sacrificial layer 180 with respect to the spacer layer 160. The removal of the sacrificial layer 180 may be performed using for instance an oxygen ($O_2$), hydrogen ($H_2$), nitrogen/hydrogen ($N_2/H_2$) or nitrogen/oxygen ($N_2/O_2$) plasma.

Figure 7:
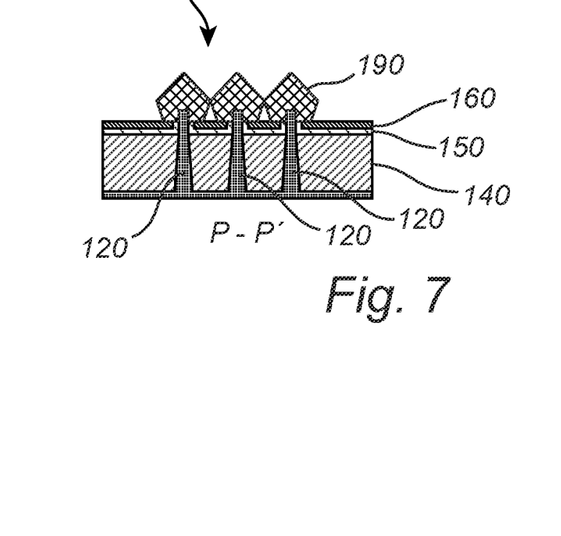

With reference to FIG. 7, the method may further proceed by performing epitaxy on exposed areas of the fin structures 120, more specifically on the (exposed) recessed fin areas. Epitaxially grown portions 190 may accordingly be formed on the recessed fin areas of the fin structures 120. The performing of the epitaxy may be performed in any manner using e.g., selective area epitaxy of, for instance, Si or SiGe. The epitaxially grown portions 190 may define the source/drains of the FET devices. The epitaxially grown portions 190 may be formed of e.g., an n-type or a p-type semiconductor material, depending on the conductivity type of the device that is to be formed. The epitaxially grown portions 190 may be doped during the performing epitaxy, e.g., by in situ doping. Alternatively, the epitaxially grown portions 190 may be doped subsequent to the performing epitaxy, e.g., by ex-situ doping. The epitaxially grown portions 190 may be formed of e.g., boron-doped silicon germanium (B-doped SiGe) or phosphorus-doped Si (P-doped Si), to provide a few non-limiting examples. Although epitaxy advantageously can be preceded by recessing of the fin structures, it is contemplated that fin recessing may be omitted and epitaxy may be performed on the (non-recessed) exposed areas of the fin structures 120.

As mentioned above, the process steps described in connection with FIGS. 2-7 may be performed in parallel (or in series) in both first region 112 and the second region 114. Accordingly, also the second set/subset of fin structures 120" may be covered (e.g., at least partially covered) by the sacrificial layer 180 and later be exposed by etching back the sacrificial layer 180 (as shown in FIG. 4), etching the spacer layer 160 and liner layer 150, and thereafter be subjected to fin recessing (as shown in FIG. 5). The sacrificial layer 180 may further be removed from both the first region 112 and the second region 114, e.g., in a same process step (as shown in FIG. 6) in some instances.

It is typically the case that both p-type and n-type FETs are to be combined on a common substrate. Accordingly, it may be desirable to form epitaxially grown portions 190 of a first conductivity type on a subset of the fin structures 120 (such as the first subset of fin structures 120') and epitaxially grown portions 190" of a second opposite conductivity type on another subset of the fin structures 120 (such as the second subset of fin structures 120").

Figure 8:
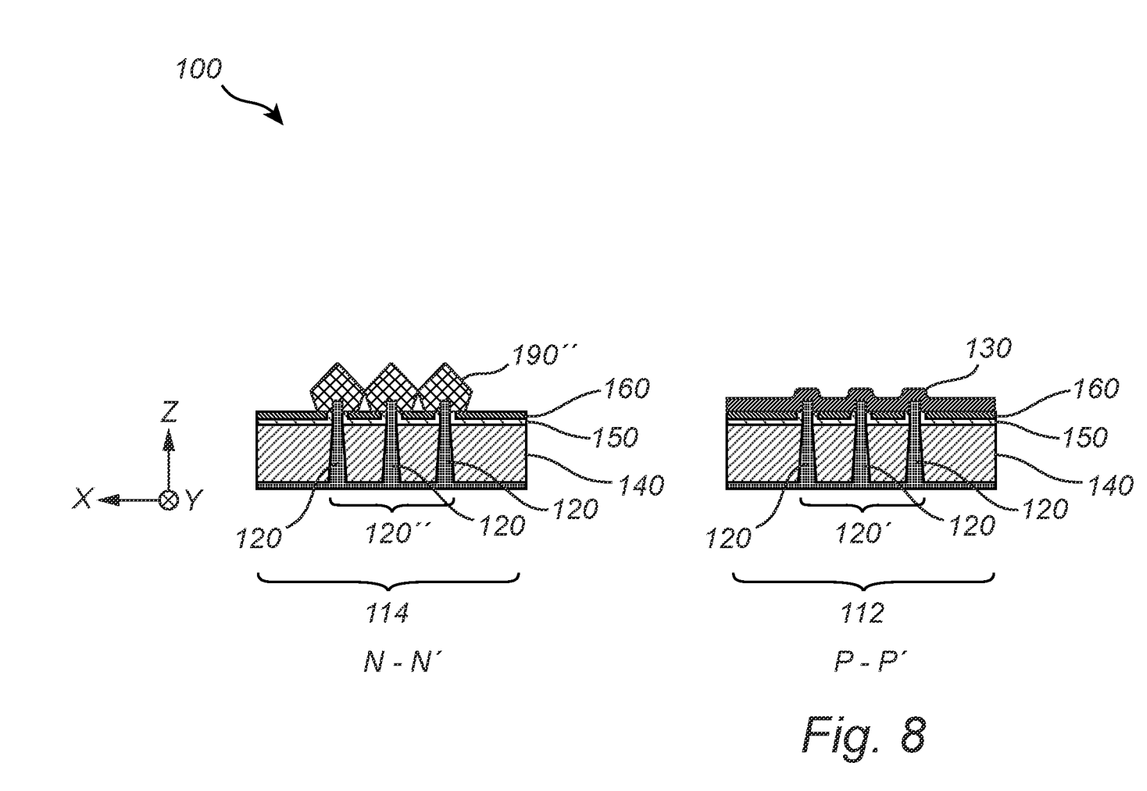

FIG. 8 shows both the first region 112 including the fin structures 120' and the second region 114 including the fin structures 120" at a stage where both the fin structures 120' in the first region 112 and the fin structures 120" in the second region 114 have been recessed, e.g., as described above in connection with FIGS. 2-6. For illustrational clarity, the first and second regions 112, 114 are shown as separate and disconnected regions but it can be understood that they belong to one and a same substrate, e.g., the substrate 110.

As shown, epitaxy may be performed on exposed areas of the second subset of fin structures 120" in the second region 114, while masking (e.g., at least partially masking) the first subset of fin structures 120' in the first region 112 with an epitaxy mask 130. Epitaxially grown portions 190" of a desired conductivity type may for example, be formed selectively on the second subset of fin structures 120". The epitaxy mask 130 may be formed e.g., by depositing a hard mask layer on the first subset 120' and the second subset 120" of fin structures 120. The hard mask layer may e.g., subsequently, be patterned (e.g., using a lithography and etching process) to form the epitaxy mask 130 covering (e.g., at least partially covering) the first subset 120' of fin structures 120 and exposing the second region 114. The epitaxy mask 130 may for instance be formed of a CVD or ALD $Si_3N_4$ layer. Subsequent to the epitaxy in the second region 114, the epitaxy mask 130 may be removed from the first region 112 and epitaxy may be performed on exposed areas of the first subset of fin structures 120' in the first region 112 while masking (e.g., at least partially masking) the second region 114 with a corresponding epitaxy mask (not shown in FIG. 8). Epitaxially grown portions of a desired conductivity type may for example, be formed selectively on the first and second subsets of fin structures.

After performing the processing described above, the method may proceed with steps such as embedding (e.g., at least partially embedding) the gate structures with interlayer dielectric (ILD), replacing the dummy gates with metal gates, source/drain and gate contact formation etc., as can be done in finFET-device processing. Although reference herein has been made to the replacement metal gate process, it is also possible to combine the disclosed processing with a gate first process. It is further contemplated to that the disclosed processing may be used in any context wherein protection of STI between fin structures is desired when fin structures are to be accessed and subjected to processing.

An alternative approach allowing separate processing in the first region 112 and the second region 114 will now be described in connection with FIGS. 9-13.

Figure 9:
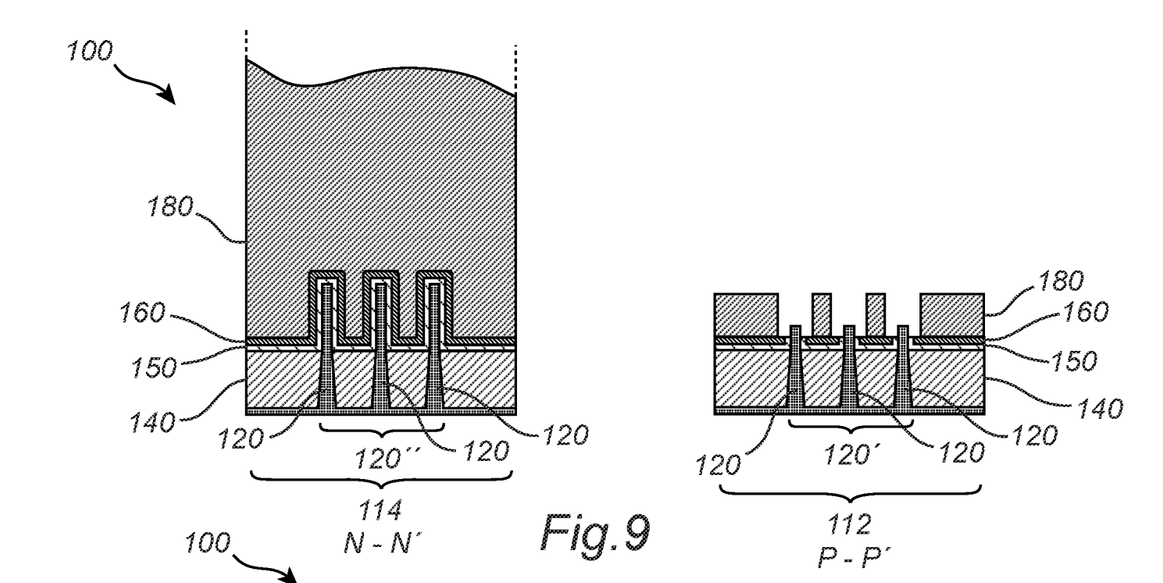

The alternative approach can be similar to the approach described above in that both the first and second regions 112, 114 are covered (e.g., at least partially covered) by the sacrificial layer 180. However, in contrast to the above described approach, the subsequent etching back of the sacrificial layer 180 can be performed selectively in the first region 112 by masking (e.g., at least partially masking) the sacrificial layer 180 in the second region 114 (e.g., by a lithographically defined resist-based mask). For example, the spacer layer portions 160f above upper surfaces of the upper portions of the first set of fin structures 120' in the first region 112 may be exposed, while the spacer layer portions 160s above the second set of fin structures 120" in the second region 114 remain covered (e.g., at least partially covered). The exposed portions of the spacer layer 160 may be etched in the first region 112 to eventually expose the upper surfaces of the fin structures in the first region 112. The method may further proceed by subjecting the first set of fin structures 120' in the first region 112 to a fin recess process to form recessed fin areas, as was described in connection with FIG. 5 above. The second set of fin structures 120" may however not be recessed but remain covered (e.g., at least partially covered) by the sacrificial layer 180. The resulting structure is illustrated in FIG. 9, showing cross sections of the structure 100 taken along planes PP' and NN' as depicted in FIG. 1. For example, FIG. 10 shows (at the right hand side) the recessed first set of fin structures 120' in the first region 112 and (at the left hand side) the non-recessed second set of fin structures 120" in the second region 114.

Figure 10:
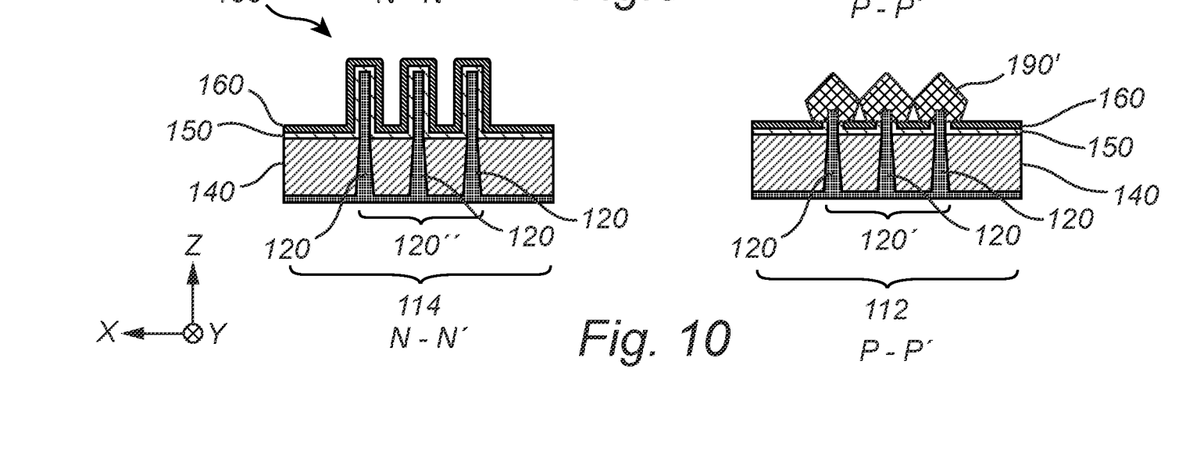

In FIG. 10, epitaxy has been performed on the recessed fin areas of the first set of fin structures 120', thereby forming epitaxially grown portions 190'. During the epitaxy, the spacer layer 160 above the second set of fin structures 120" may act as an epitaxial mask, counteracting growth on the second set of fin structures 120". Due to the elevated temperatures during the epitaxy, the sacrificial layer 180 may advantageously be removed from the first and second region 112, 114 prior to the epitaxy in some instances. The removal of the sacrificial layer 180 and the epitaxy may be performed in a similar manner, as described above in connection with FIGS. 6 and 7, respectively. The epitaxially grown portions 190' may be doped in-situ or ex-situ, as described above.

Figure 11:
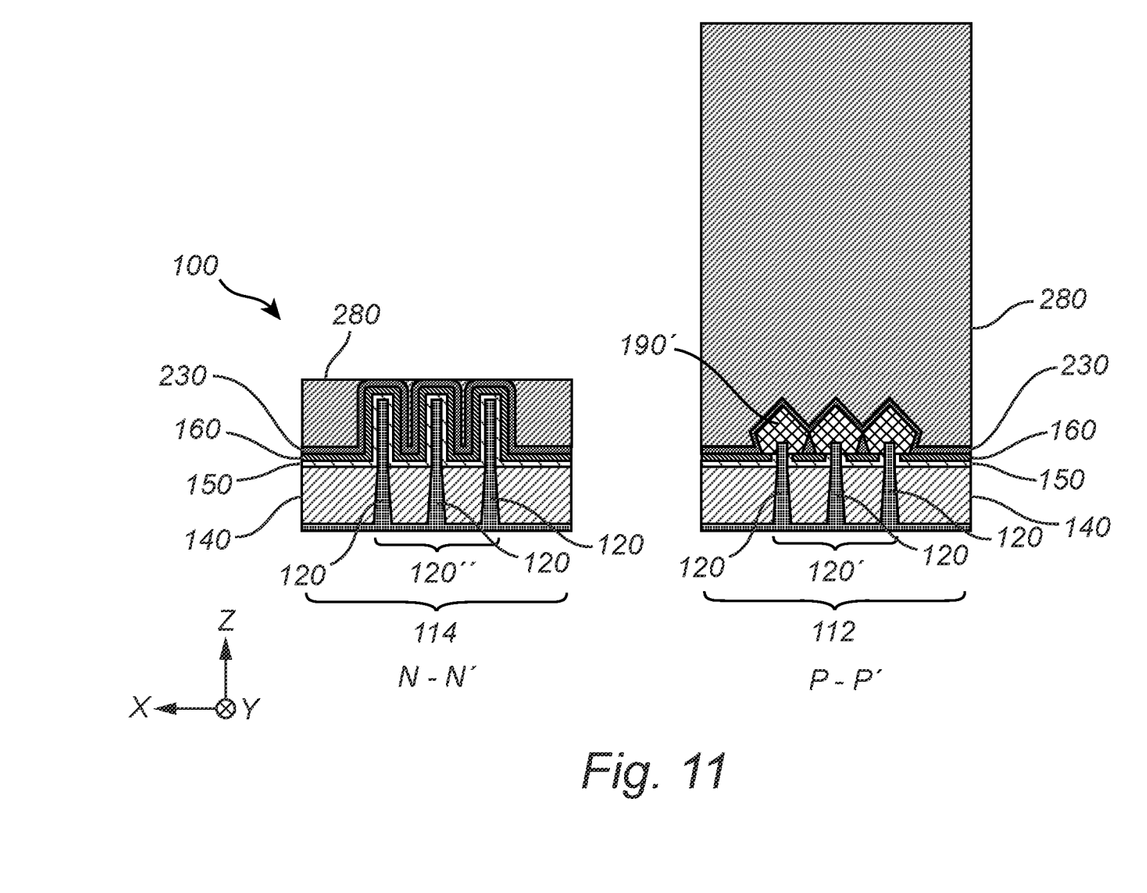

In FIG. 11, a (preliminary) epitaxy mask 230 has been formed on the structure 100. The epitaxy mask 230 may be formed by a hard mask material, in a similar manner as described in connection with the epitaxy mask 130. The epitaxy mask 230 may cover (e.g., at least partially cover) the structure 100 in the first region 112 and in the second region 114. More specifically, the epitaxy mask 230 may cover (e.g., at least partially cover) the epitaxially grown portions 190', and also the STI spacer layer portions 160f remaining on the STI-layer 140 in the first region 112. The epitaxy mask 230 may further cover (e.g., at least partially cover) the spacer layer 160 in the second region 114.

FIG. 11 further shows that a (second) sacrificial layer 280 has been formed over the epitaxy mask 230. The sacrificial layer 280 may be formed in a same manner and of any of the materials discussed in connection with the sacrificial layer 180. The sacrificial layer 280 may for example, embed (e.g., at least partially embed) the second set of fin structures 120" covered (e.g., at least partially covered) by the (optional) liner layer 150, the spacer layer 160 and the epitaxy mask 230. The sacrificial layer 280 may also embed (e.g., at least partially embed) the epitaxially grown portions 190' covered (e.g., at least partially covered) by the epitaxy mask 230. As FIG. 11 further shows, the sacrificial layer 280 can be subsequently partially etched back selectively in the second region 114 by masking (e.g., at least partially masking) the sacrificial layer 280 in the first region 112 (e.g., by a lithographically defined resist-based mask). For example, the portions of the epitaxy mask 230 above the upper surfaces of the upper portions of the second set of fin structures 120" in the second region 114 may be exposed, while the portions of the epitaxy mask 230 above the first set of fin structures 120' in the first region 112 remain covered (e.g., at least partially covered).

Figure 12:
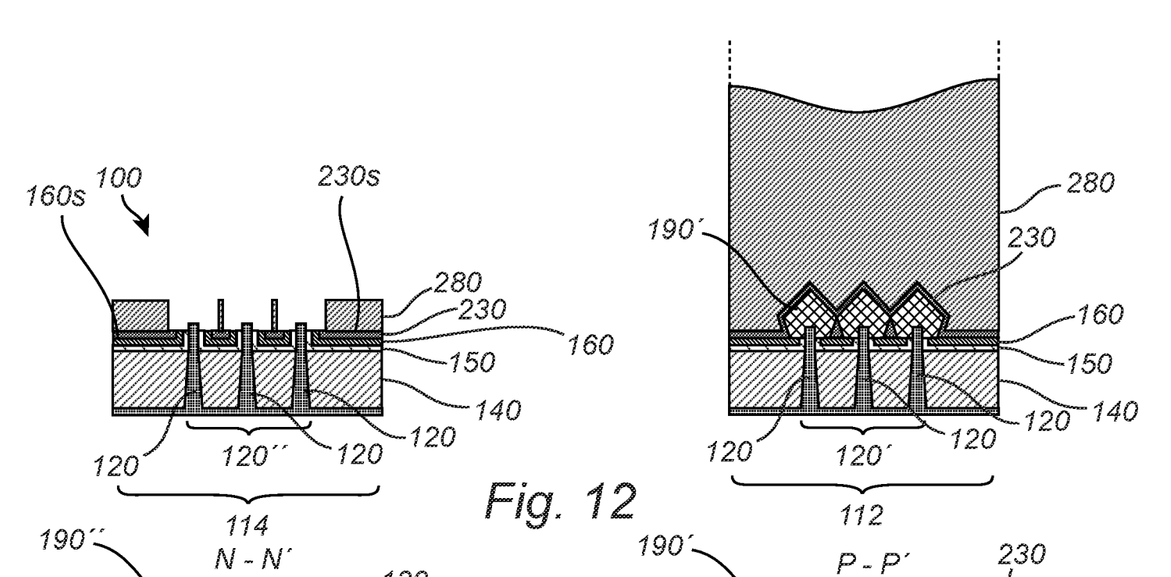
Figure 13:
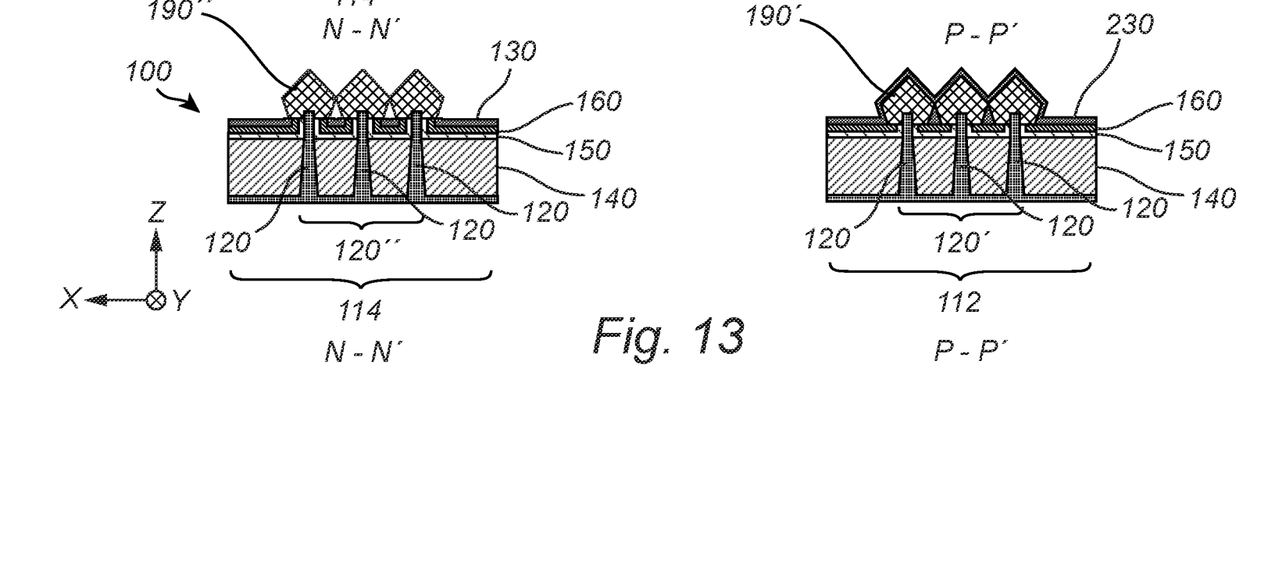

In FIG. 12, upper surfaces of the upper portions 120a of the second set of fin structures 120" have been exposed by etching the epitaxy mask 230, the spacer layer 160 and the liner layer 150, while the sacrificial layer 280 masks (e.g., at least partially masks) the spacer layer portions 160s (e.g., at least partially covered by the epitaxy mask portions 230s) above the STI-layer 140. Once exposed, the etching has continued to achieve recessing of the second set of fins 120" (as shown in FIG. 12). Similar to what was discussed above, the epitaxy mask 230, the spacer layer 160, the liner layer 150 and the fin structures 120 may be etched in a single continuous etch process, or in a number of separate etch steps. Thereafter the method may proceed by performing epitaxy on the recessed fin areas to form epitaxially grown portions 190" in the second region 114 (as shown in FIG. 13). The sacrificial layer 280 may be removed from the first and second regions 112, 114 prior to the epitaxy. During the epitaxy, the remaining portions of the epitaxy mask 230 in the first region 112 can counteract (further) epitaxial growth on the first set of fin structures 120'.

While methods and processes may be depicted in the drawings and/or described in a particular order, it is to be recognized that the steps need not be performed in the particular order shown or in sequential order, or that all illustrated steps be performed, to achieve desirable results. Further, other steps that are not depicted may be incorporated in the example methods and processes that are schematically illustrated. For example, one or more additional steps may be performed before, after, simultaneously, or between any of the illustrated steps. Additionally, the steps may be rearranged or reordered in other embodiments.

In the above the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A method comprising:
   providing a substrate, the substrate supporting a shallow trench isolation layer (STI-layer) and a set of fin structures, each fin structure comprising an upper portion protruding above the STI-layer;
   forming a spacer layer over the upper portions of the set of fin structures and the STI-layer;
   forming a sacrificial layer over the spacer layer, the sacrificial layer at least partially embedding the upper portions of the fin structures;

partially etching back the sacrificial layer to expose spacer layer portions above upper surfaces of the upper portions of the set of fin structures; and etching the spacer layer and exposing at least the upper surfaces of the upper portions of the set of fin structures, while the sacrificial layer at least partially masks spacer layer portions above the STI-layer.

2. The method according to claim 1, further comprising performing one or more processing steps on exposed areas of the fin structures.

3. The method according to claim 1, further comprising subjecting the fin structures to a fin recess process comprising etching back exposed areas of the fin structures.

4. The method according to claim 3, further comprising removing the sacrificial layer subsequent to the fin recess process.

5. The method according to claim 1, further comprising performing epitaxy on exposed areas of the fin structures.

6. The method according to claim 1, wherein the set of fin structures comprises a first subset of fin structures in a first region and a second subset of fin structures in a second region.

7. The method according to claim 6, wherein subsequent to etching the spacer layer and exposing at least the upper surfaces of the upper portions of the first and second subsets of fin structures:

forming an epitaxy mask over the first subset of fin structures in the first region;

performing epitaxy on exposed areas of the second subset of fin structures in the second region, while the epitaxy mask at least partially masks the first subset of fin structures in the first region; and removing the epitaxy mask from the first region.

8. The method according to claim 7, further comprising forming an epitaxy mask over the second region and performing epitaxy on exposed areas of the first subset of fin structures in the first region.

9. The method according to claim 1, wherein the set of fin structures forms a first set of fin structures in a first region of the substrate, the substrate further supporting a second set of fin structures in a second region of the substrate.

10. The method according to claim 9, wherein the spacer layer, and the sacrificial layer are formed in both the first region and the second region, wherein the partially etching back of the sacrificial layer is performed in the first region while at least partially masking the sacrificial layer in the second region, and wherein the etching the spacer layer is performed in the first region while the sacrificial layer at least partially masks the spacer layer in the second region.

11. The method according to claim 10, the method further comprising:

subjecting the first set of fin structures to a fin recess process comprising etching back exposed areas of the first set of fin structures; and performing epitaxy on the exposed areas of the first set of fin structures.

12. The method according to claim 10, further comprising performing epitaxy on exposed areas of the first set of fin structures.

13. The method according to claim 12, further comprising:

forming an epitaxy mask over the first region;

in the second region partially etching back the sacrificial layer; and subsequently, in the second region, etching the spacer layer and exposing at least the upper surfaces of the upper portions of the second set of fin structures, while the sacrificial layer at least partially masks spacer layer portions above the STI-layer.

14. The method according to claim 13, the method further comprising:

subjecting the second set of fin structures to a fin recess process comprising etching back exposed areas of the second set of fin structures; and performing epitaxy on the exposed areas of the second set of fin structures.

15. The method according to claim 13, further comprising performing epitaxy on exposed areas of the second set of fin structures.

16. The method according to claim 1, wherein the substrate supports a gate structure extending across the set of fin structures, wherein the spacer layer forms a gate spacer layer and is formed over the gate structure, the upper portions of the set of fin structures and the STI-layer.

17. The method according to claim 1, wherein the spacer layer comprises silicon oxycarbide or silicon nitride.

18. The method according to claim 1, wherein forming a spacer layer over the upper portions of the set of fin structures and the STI-layer comprises forming a conformal spacer layer over the upper portions of the set of fin structures and the STI-layer.

* * * * *